(12) United States Patent
Kosuga et al.

(10) Patent No.: US 11,094,658 B2
(45) Date of Patent: Aug. 17, 2021

(54) SUBSTRATE, ELECTRONIC SUBSTRATE, AND METHOD FOR PRODUCING ELECTRONIC SUBSTRATE

(71) Applicant: LENOVO (SINGAPORE) PTE. LTD., Singapore (SG)

(72) Inventors: Tadashi Kosuga, Yokohama (JP); Tin-Lup Wong, Morrisville, NC (US)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 189 days.

(21) Appl. No.: 16/530,685

(22) Filed: Aug. 2, 2019

(65) Prior Publication Data

US 2020/0373268 A1    Nov. 26, 2020

Related U.S. Application Data

(60) Provisional application No. 62/851,352, filed on May 22, 2019.

(51) Int. Cl.
*H01L 23/00* (2006.01)
*H01L 23/13* (2006.01)
*H01L 23/498* (2006.01)

(52) U.S. Cl.
CPC .............. *H01L 24/16* (2013.01); *H01L 23/13* (2013.01); *H01L 23/49838* (2013.01); *H01L 24/81* (2013.01); *H01L 2224/16227* (2013.01); *H01L 2224/16237* (2013.01); *H01L 2224/81007* (2013.01); *H01L 2224/81411* (2013.01); *H01L 2224/81413* (2013.01); *H01L 2224/81447* (2013.01); *H01L 2224/81455* (2013.01); *H01L 2224/81815* (2013.01)

(58) Field of Classification Search
CPC ....................................................... H01L 24/16
See application file for complete search history.

(56) References Cited

U.S. PATENT DOCUMENTS

| | | | |
|---|---|---|---|
| 10,373,893 B2* | 8/2019 | Vaidya | H01L 21/76898 |
| 10,660,216 B1* | 5/2020 | Kosuga | H05K 3/3421 |
| 2009/0053459 A1* | 2/2009 | Hirose | H05K 1/112 |
| | | | 428/76 |
| 2009/0154128 A1* | 6/2009 | Tamadate | H01L 23/3128 |
| | | | 361/783 |
| 2009/0229861 A1* | 9/2009 | Hando | H01L 23/49811 |
| | | | 174/250 |
| 2009/0283900 A1* | 11/2009 | Yamada | H01L 23/3128 |
| | | | 257/698 |

(Continued)

FOREIGN PATENT DOCUMENTS

| | | |
|---|---|---|
| JP | 39162527 A | 6/1997 |
| JP | 2001267717 A | 9/2001 |

(Continued)

*Primary Examiner* — Douglas M Menz
(74) *Attorney, Agent, or Firm* — Shimokaji IP

(57) ABSTRACT

A substrate is capable of effectively reinforcing a connecting portion between an electronic component and the substrate. The substrate is a substrate on which a first electronic component having a plurality of bumps is to be mounted, and includes a base portion including an insulator and having, on the upper face thereof, at least one groove portion configured to store a tip portion of at least one of the bumps, and includes an electrode formed on at least the bottom face of the groove portion.

3 Claims, 21 Drawing Sheets

(56) References Cited

U.S. PATENT DOCUMENTS

| | | | | |
|---|---|---|---|---|
| 2010/0193949 A1* | 8/2010 | Belanger | ............... | H01L 24/03 |
| | | | | 257/738 |
| 2010/0314757 A1* | 12/2010 | Sugiyama | ......... | H01L 23/49827 |
| | | | | 257/737 |
| 2012/0126416 A1* | 5/2012 | Lee | ................. | H01L 25/50 |
| | | | | 257/774 |
| 2012/0126429 A1* | 5/2012 | Do | ................. | H01L 24/14 |
| | | | | 257/777 |
| 2012/0299183 A1* | 11/2012 | Fujisawa | ............ | H01L 23/562 |
| | | | | 257/738 |
| 2017/0117243 A1* | 4/2017 | Katkar | ................. | H01L 24/49 |

FOREIGN PATENT DOCUMENTS

| | | |
|---|---|---|
| JP | 2001320145 A | 11/2001 |
| JP | 2008171975 A | 7/2008 |
| JP | 2009099637 A | 5/2009 |
| JP | 2016-143357 A | 8/2016 |
| JP | 2018082084 A | 5/2018 |
| WO | 2008111345 A1 | 9/2008 |
| WO | 2018042846 A1 | 3/2018 |

* cited by examiner

SUBSTRATE, ELECTRONIC SUBSTRATE, AND METHOD FOR PRODUCING ELECTRONIC SUBSTRATE

CROSS REFERENCE TO RELATED APPLICATIONS

This application claims the benefit of and priority to U.S. provisional application No. 62/851,352 filed May 22, 2019 which is incorporated herein.

FIELD OF THE INVENTION

The present invention relates to a substrate, an electronic substrate, and a method for producing an electronic substrate.

BACKGROUND OF THE INVENTION

Electronic components have been mounted on substrates with solder. To downsize electronic apparatuses, an electronic component is mounted on a substrate by flip-chip bonding or the like, and to reinforce a connecting portion between the electronic component and the substrate, a resin material is packed between the electronic component and the substrate, or a resin material is applied to corner areas of the electronic component (for example, see Japanese Unexamined Patent Application Publication No. 2016-143357).

SUMMARY OF THE INVENTION

The technique disclosed in Japanese Unexamined Patent Application Publication No. 2016-143357 needs additional steps for packing a resin material after mounting of an electronic component and for curing the resin material. Packing of a resin material can reinforce the connecting portion, but the resin material and the substrate have a large difference in thermal expansion coefficient, and thus the connecting portion may be broken by thermal stress when a thermal load is applied.

In view of the above circumstances, the present invention is intended to provide a substrate capable of effectively reinforcing a connecting portion between an electronic component and the substrate, an electronic substrate, and a method for producing an electronic substrate.

A substrate according to the first aspect of the present invention is a substrate on which a first electronic component having a plurality of bumps is to be mounted, and the substrate includes: a base portion including an insulator and having, on an upper face thereof, at least one groove portion configured to store a tip portion of at least one of the bumps of the first electronic component; and an electrode provided on at least a bottom face of the groove portion.

An electronic substrate according to the second aspect of the present invention includes: a first electronic component having a plurality of bumps; and a substrate that includes a base portion including an insulator and having, on an upper face thereof, at least one groove portion configured to store a tip portion of at least one of the bumps of the first electronic component and includes an electrode provided on at least a bottom face of the groove portion, and the tip portion of the bump is stored in the groove portion and is electrically connected to the electrode through a first solder alloy.

A method for producing an electronic substrate according to the third aspect of the present invention includes: preparing a substrate that includes a base portion including an insulator and having, on an upper face thereof, at least one groove portion configured to store a tip portion of a bump of the first electronic component and includes an electrode provided on at least a bottom face of the groove portion; packing a first solder alloy in the groove portion of the substrate; placing the first electronic component on an upper face of the substrate such that the tip portion of the bump is stored in the groove portion of the substrate; and heating the first solder alloy at a temperature at which the first solder alloy melts.

The above-described aspects of the present invention can suppress or avoid breakage of a connecting portion between an electronic component and a substrate even when a thermal stress is applied.

DETAILED DESCRIPTION OF THE INVENTION

Preferred embodiments of a substrate, an electronic substrate, and a method for producing an electronic substrate according to the present invention will now be described in detail with reference to the accompanying drawings.

Figure 1:
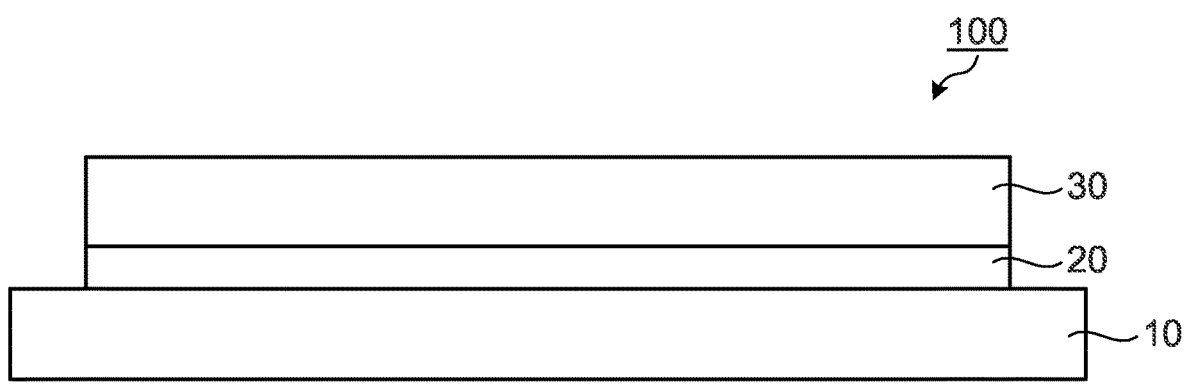
FIG. 1 is a schematic view of an electronic substrate according to a first embodiment.

FIG. 1 is a schematic view of an electronic substrate 100 according to a first embodiment. The electronic substrate 100 includes a substrate 10, a resin sheet 20, and a first electronic component 30. The electronic substrate 100 includes the single first electronic component 30 mounted through the resin sheet 20 on the substrate 10, but an electronic substrate 100 may include two or more first electronic components 30 mounted on a substrate 10.

Figure 2A:
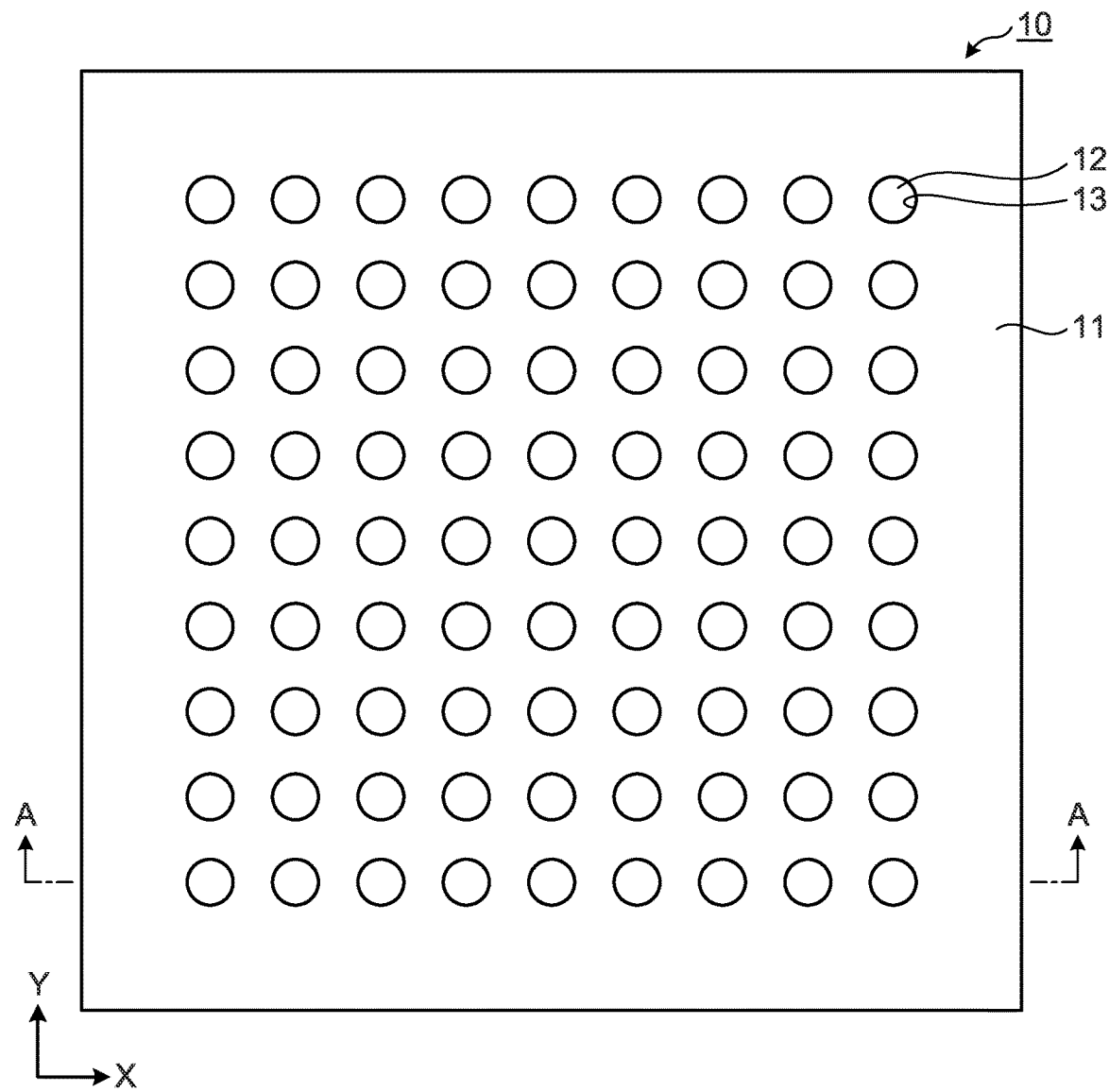
FIG. 2A is a plan view of a substrate according to the first embodiment.
Figure 2B:
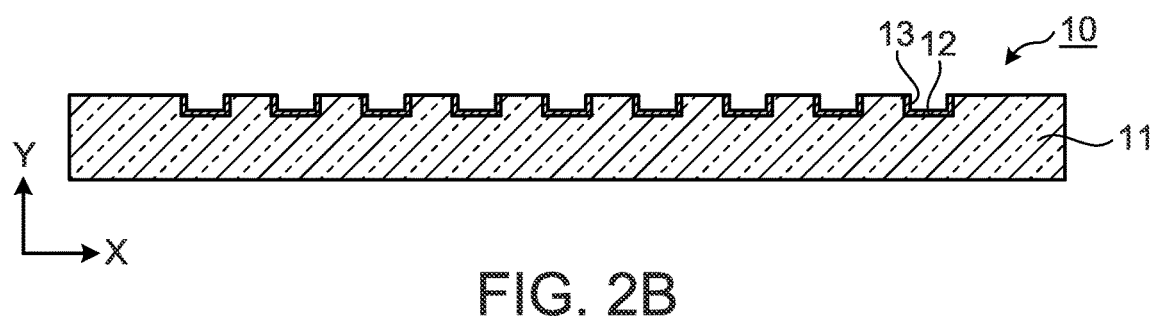
FIG. 2B is a cross-sectional view taken along line A-A in FIG. 2A.

FIG. 2A is a plan view of a substrate 10 according to the first embodiment, and FIG. 2B is a cross-sectional view taken along line A-A in FIG. 2A. The substrate 10 is made from an insulator, includes a rectangular base portion 11 having groove portions 13 formed on an upper face thereof, and includes electrodes 12 that are made from an electric conductor and are each provided on a bottom face and a side face of the corresponding groove portion 13. A plurality of the groove portions 13 are provided on the upper face of the base portion 11 in a grid pattern, and in the example of FIG. 2A, the number of the groove portions is 81 that is the same as the number of bumps 32 of the first electronic component 30 described later. The groove portions 13 are provided at positions corresponding to the bumps 32 of the first electronic component 30 and each have such a size as to store a tip portion of the corresponding bump 32. In FIG. 2A, each groove portion 13 has a cylinder shape with a bottom, but the shape is not limited to this and may be a prismatic shape as long as the tip portion of the bump 32 can be stored. In the present specification, the thickness direction of a substrate 10 is regarded as a vertical direction (Z direction), one direction orthogonal to the vertical direction is regarded as a transverse direction (X-direction), and the direction orthogonal to the vertical direction and the transverse direction is regarded as a longitudinal direction (Y-direction). A substrate 10 has an upper face that is to come into contact with a resin sheet 20, and the face opposite thereto is regarded as a lower face.

Figure 3A:
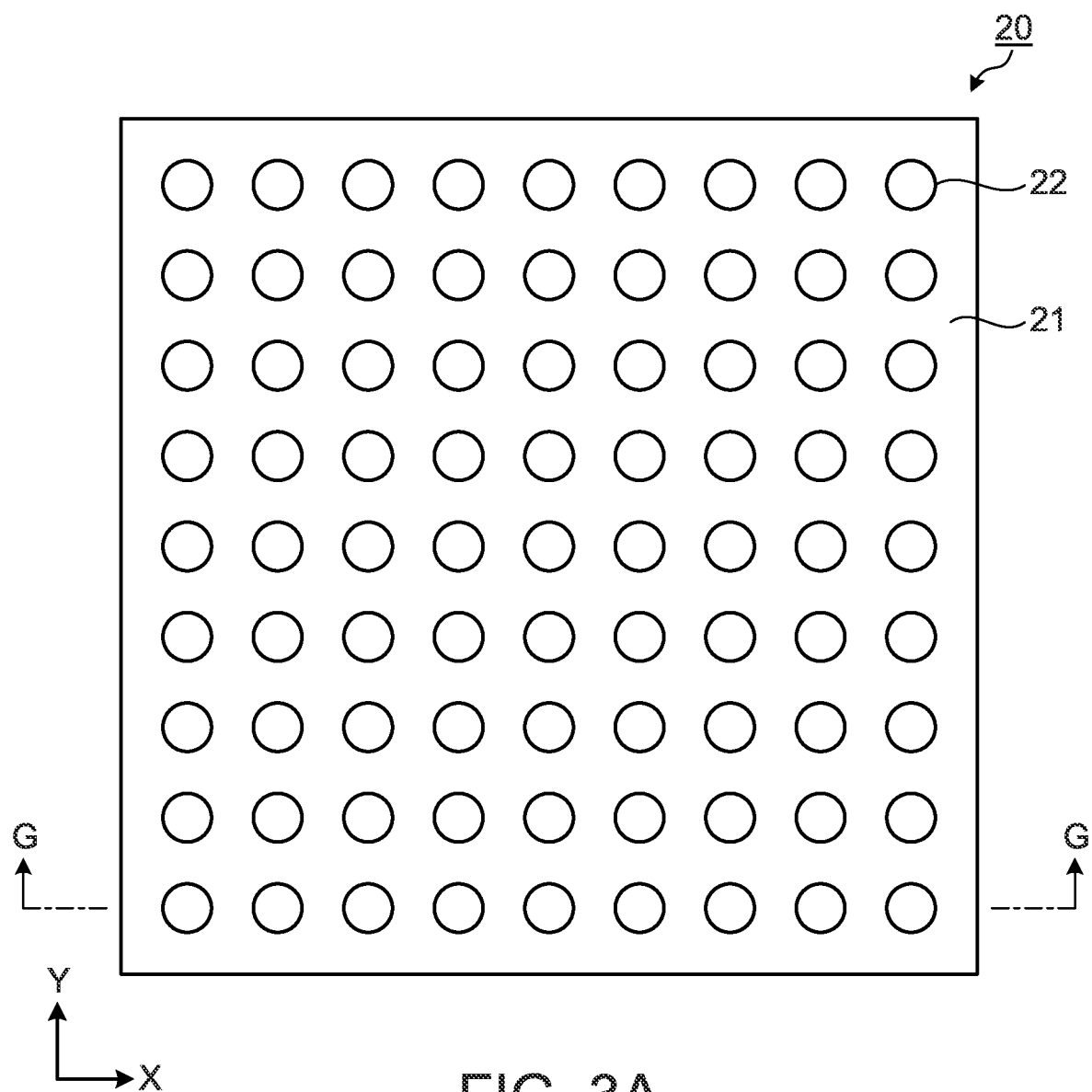
FIG. 3A is a plan view of a resin sheet according to the first embodiment.
Figure 3B:
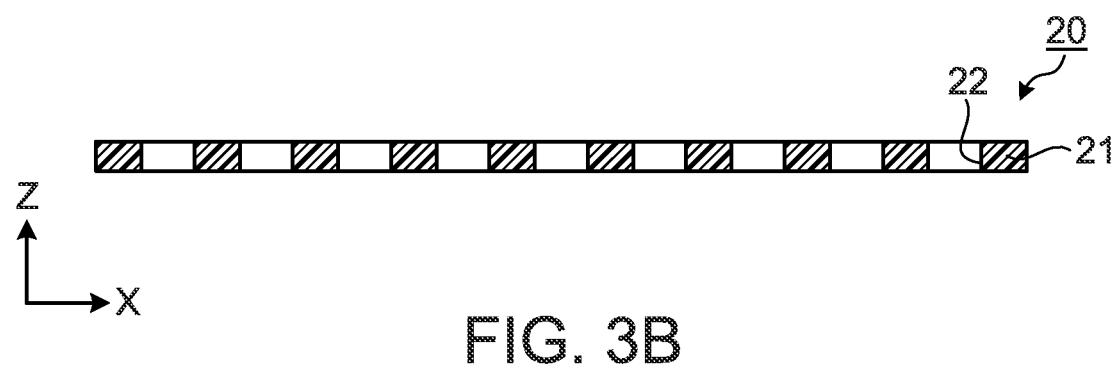
FIG. 3B is a cross-sectional view taken along line G-G in FIG. 3A.

FIG. 3A is a plan view of a resin sheet 20 according to the first embodiment, and FIG. 2B is a cross-sectional view taken along line G-G in FIG. 2A. The resin sheet 20 includes a rectangular main body 21 and through-holes 22 penetrating the main body 21 in the thickness direction. The through-holes 22 are provided at positions corresponding to the bumps 32 of the first electronic component 30 in the same manner as the groove portions 13 of the substrate 10 and each have such a size as to store the bump 32 when the first electronic component 30 is placed on the resin sheet 20. The through-hole 22 may have a diameter equal to or larger than the diameter of the bump 32 and is about 1.05 to 1.20 times the diameter of the bump 32 in order to facilitate the storage of the bump 32 in the through-hole 22, to downsize an electronic substrate 100, and to allow the main body 21 to protect the connection portion by adhesion between the electrode 12 and the bump 32. In FIG. 3A, the through-hole 22 has a cylinder shape, but the shape is not limited to this and may be a prismatic shape as long as the bump 32 can be stored.

The main body 21 is made from a previously cured resin. The main body 21 is selected from under fill materials such as an epoxy resin, a silicone resin, and an acrylic resin. A previously cured main body 21 enables formation of through-holes 22 with a predetermined shape. The main body 21 may contain a filler such as glass. The resin sheet 20 may have a cover film covering the main body 21.

Figure 4A:
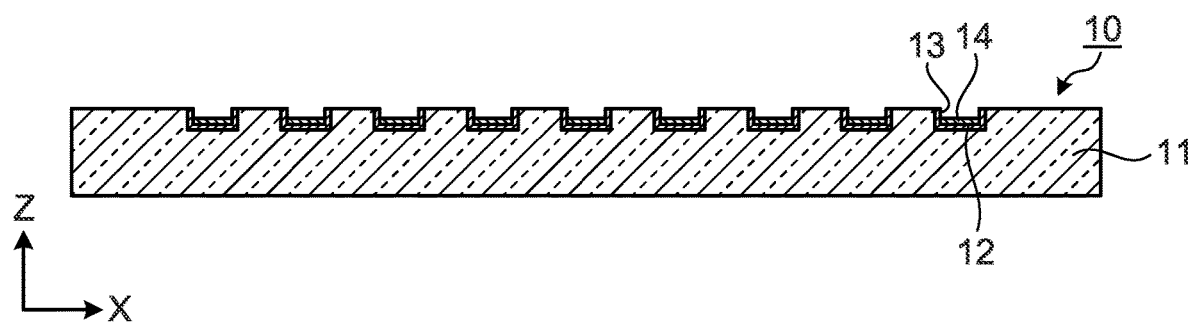
FIG. 4A is a view illustrating a method for producing the electronic substrate according to the first embodiment.
Figure 4B:
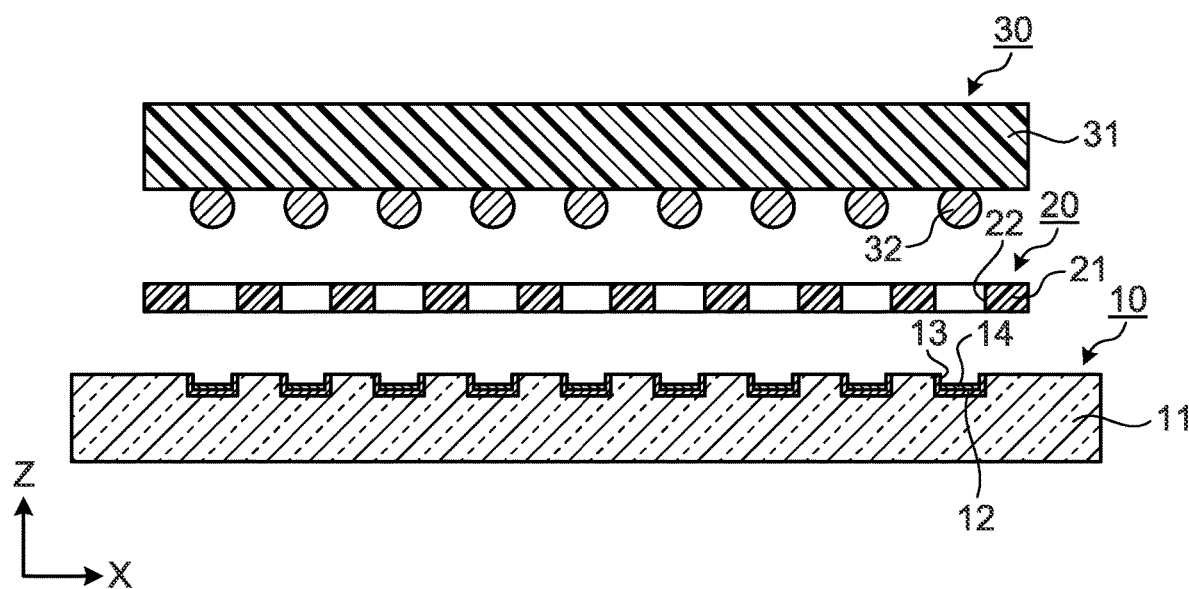
FIG. 4B is a view illustrating the method for producing the electronic substrate according to the first embodiment and is a cross-sectional view before assembling a substrate, a resin sheet, and a first electronic component.

A first electronic component 30 includes a main body 31 and bumps 32 to be electrically connected to electrodes 12 of a substrate 10 (see FIG. 4B and the like). The first electronic component 30 includes the main body 31 and the bumps 32 and is to be mounted with the electrodes 12 of the substrate 10 by reflow soldering. The first electronic component 30 may be any electronic component that is to be mounted through bumps 32 on a substrate 10 and is preferably a ball grid array (BGA) or a chip size package (CSP). The bump 32 includes a ball of a BGA. The bump 32 is made from a solder ball, gold, copper, or the like, and the bump 32 has a diameter of, for example, 100 to 1,000 µm.

Next, with reference to figures, a method for producing an electronic substrate 100 will be described. FIG. 4A to FIG. 4E are views illustrating a method for producing the electronic substrate 100 according to the first embodiment. The method for producing the electronic substrate 100 includes a packing step, a resin sheet placing step, an electronic component placing step, and a mounting step.

In the packing step, a first solder alloy 14 is packed in the groove portions 13 of the substrate 10 as shown in FIG. 4A. The first solder alloy 14 is applied onto the electrodes 12 in the groove portions 13.

The first solder alloy 14 is preferably a solder alloy having a melting point lower than that of the bumps 32. The first solder alloy 14 preferably has a melting point of, for example, 150° C. or less. By using a low-melting solder alloy as the first solder alloy 14, the first electronic component 30 can be mounted at a lower heating temperature, and this can reduce the thermal load applied to the first electronic component 30. Examples of the solder alloy having a melting point of 150° C. or less include Sn—Bi solder alloys. Specific examples of the Sn—Bi solder alloy include Sn—Bi solder alloy, Sn—Bi—Cu solder alloy, Sn—Bi—Ni solder alloy, Sn—Bi—Cu—Ni solder alloy, Sn—Bi—Ag solder alloy, and Sn—Bi—Sb solder alloy.

The Sn—Bi solder alloy preferably has a Bi content of 30 to 80% by mass. When having a Bi content within the range, for example, a solder alloy can have a melting point of 138° C. In order to reduce the melting point, the Bi content is more preferably 35 to 70% by mass and particularly preferably 53 to 61% by mass. When Cu or Ni is added to the Sn—Bi solder alloy, such a component is preferably added at a Cu content of 0.1 to 1.0% by mass or a Ni content of 0.01 to 0.1% by mass.

As the material of the bumps 32, for example, Sn—Cu solder alloy, Sn—Ag solder alloy, Sn—Ag—Cu solder alloy, Sn—Ag—Cu—Ni solder alloy, Sn—Ag—Cu—Sb solder alloy, Sn—Ag—Cu—Ni—Sb solder alloy, or the like can be used. The material of the bumps 32 is preferably a solder alloy having such a melting point that the bumps do not melt when the first electronic component 30 is mounted, such as a solder alloy having a high melting point of 200° C. or more, but a low-melting solder that melts at the time of mounting of the first electronic component 30 may be used.

Figure 4C:
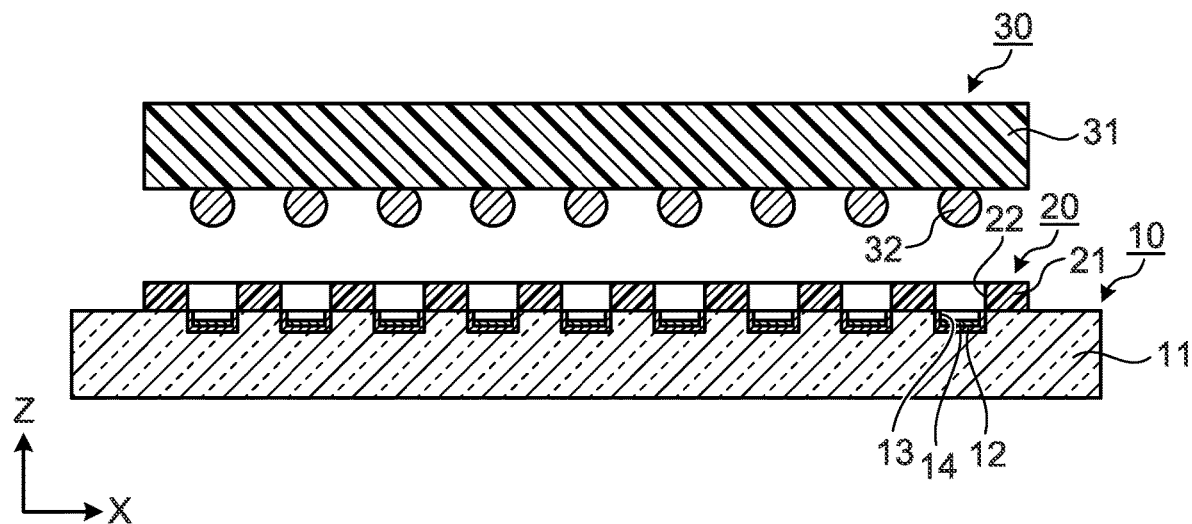
FIG. 4C is a view illustrating the method for producing the electronic substrate according to the first embodiment and is a cross-sectional view before flip-chip bonding the first electronic component with the resin sheet placed on the substrate.

In the resin sheet placing step, the lower face of the resin sheet 20 is allowed to face the upper face of the substrate 10 and is placed on the substrate 10, as shown in FIG. 4B and FIG. 4C. The placing is performed in such way that the positions of the through-holes 22 of the resin sheet 20 are fitted onto the groove portions 13 of the substrate 10. The fitting can be performed by image control, positioning pins, or the like.

Figure 4D:
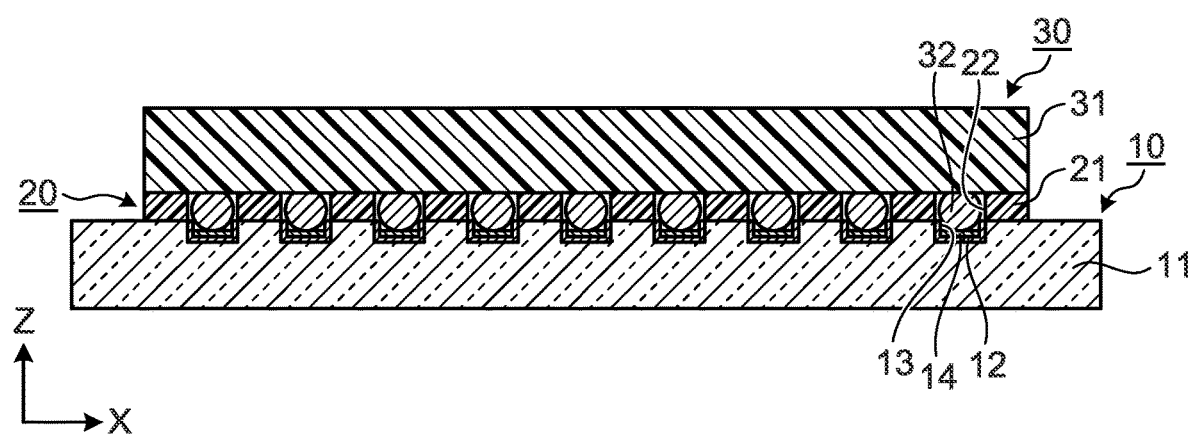
FIG. 4D is a view illustrating the method for producing the electronic substrate according to the first embodiment and is a cross-sectional view in which the substrate, the resin sheet, and the electronic component have been assembled.

The electronic component placing step is a step of placing the first electronic component 30 on the resin sheet 20, as shown in FIG. 4D. The electronic component placing step may be performed before the resin sheet placing step. The electronic component placing step is performed in such a way that the positions of the bumps 32 of the first electronic component 30 are fitted onto the through-holes 22 of the resin sheet 20. By the fitting, the bumps 32 are stored (inserted) in the through-holes 22. The fitting can be performed by image control, positioning pins, or the like. The amount of the first solder alloy 14 is preferably adjusted so that the bumps 32 come into contact with the first solder alloy 14. When the self-weight of a first electronic component 30 can bring bumps 32 into contact with a first solder alloy 14 to enable electrical connection to electrodes 12 in the mounting step of the first electronic component 30 described later, the bumps 32 are not necessarily in contact with the first solder alloy 14, or the tip portions of the bumps 32 are not necessarily stored (positioned) in the groove portions 13 in the electronic component placing step.

Figure 4E:
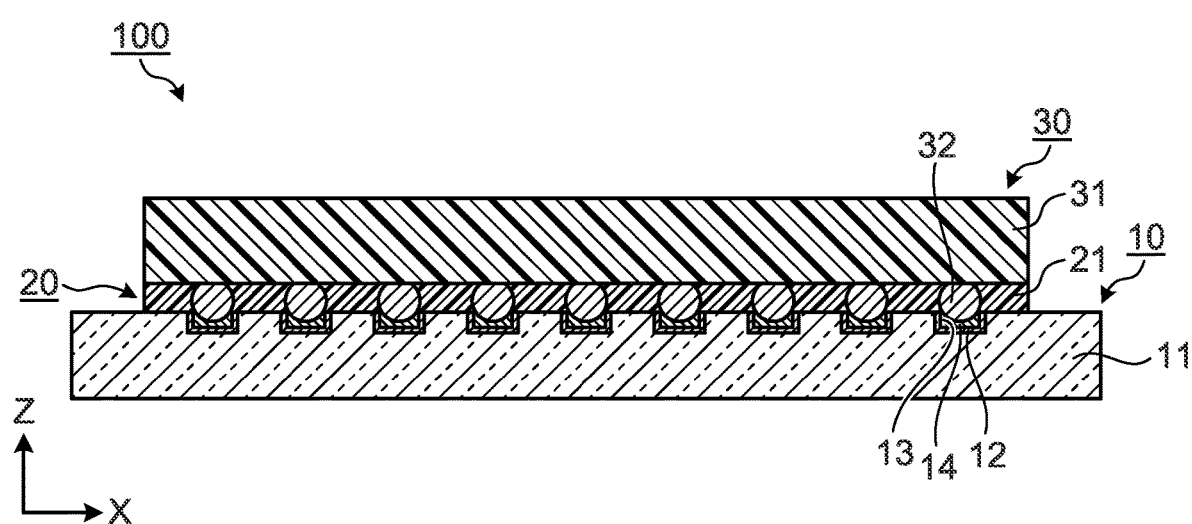
FIG. 4E is a view illustrating the method for producing the electronic substrate according to the first embodiment and is a cross-sectional view in which the substrate, the resin sheet, and the first electronic component have been assembled and mounted by application of heat.

In the mounting step, the bumps 32 of the first electronic component 30 are electrically connected to the electrodes 12 of the substrate 10 through the first solder alloy 14, as shown in FIG. 4E. The mounting step is preferably performed by reflowing. The mounting step is performed by heating the substrate 10 and the first electronic component 30 with interposing the resin sheet 20 therebetween, in a reflow furnace. By heat, the first solder alloy 14 melts, and the bumps 32 and the electrodes 12 are electrically connected through the first solder alloy 14. In addition, the previously cured resin portion 20 is cured by heat and physically connects the first electronic component 30 to the substrate 10. In the mounting step, the heating temperature is, for example, 150 to 180° C. Before reflowing, preheating at about 50 to 100° C. may be performed to remove solvents in the first solder alloy 14.

Figure 5A:
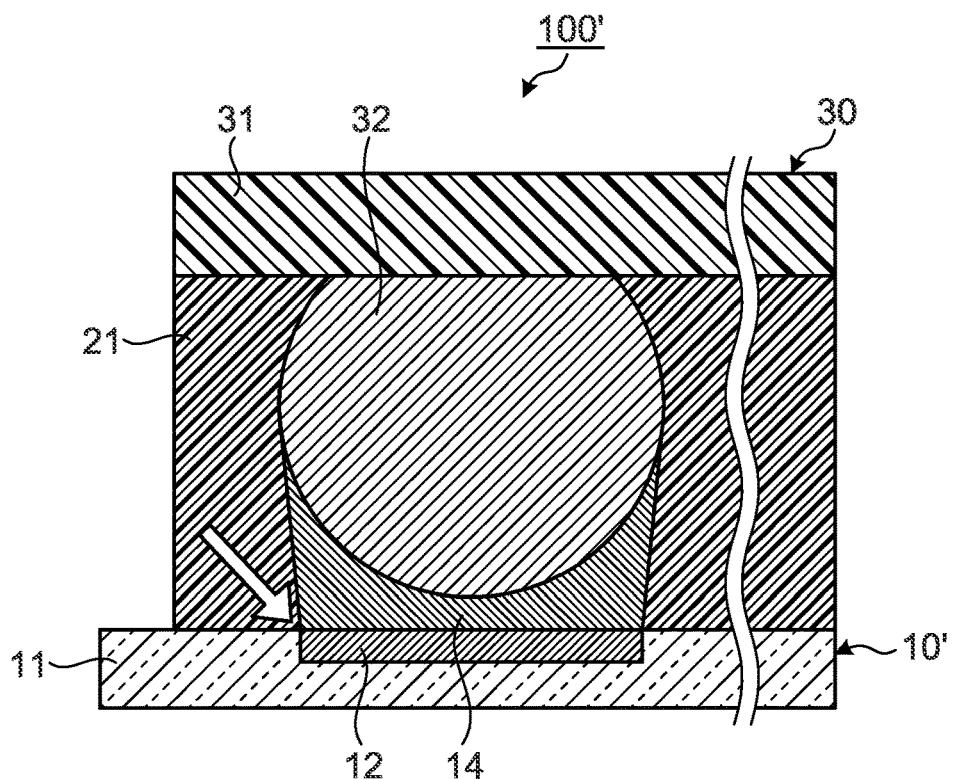
FIG. 5A is a view illustrating the structure of a conventional connecting portion of a bump and an electrode.
Figure 5B:
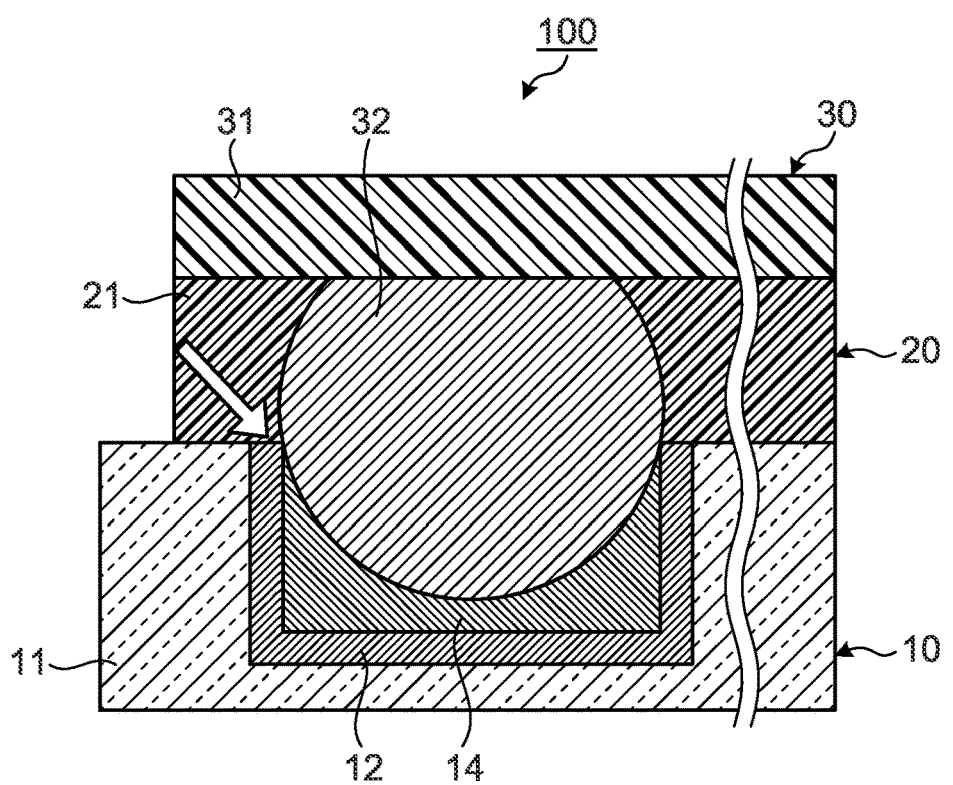
FIG. 5B is a view illustrating the structure of the connecting portion of a bump and an electrode according to the first embodiment.

FIG. 5A is a view illustrating the structure of a conventional connecting portion of a bump 32 and an electrode 12, and FIG. 5B is a view illustrating the structure of the connecting portion of the bump 32 and the electrode 12 according to the first embodiment. In conventional flip-chip mounting as shown in FIG. 5A, when a thermal load is applied to an electronic substrate 100', and a substrate 10' is deformed due to a difference in thermal expansion coefficient between a resin sheet 20 and the substrate 10', the stress is concentrated at the connection interface between the electrode 12 and a first solder alloy 14 indicated by the arrow in the drawing, and cracks and the like are generated from the interface in the solder or the substrate 10'. In contrast, in the first embodiment in which the tip portion of the bump 32 is stored in the groove portion 13 as shown in FIG. 5B, when the substrate 10 is deformed by a thermal stress, a stress is applied to the peripheral part of the bump 32 indicated by the arrow in the drawing, but the bump 32 has high rigidity due to its shape, and thus breakage of the connecting portion by the thermal stress can be suppressed.

As described above, in the electronic substrate 100 according to the first embodiment, the bumps 32 of the first electronic component 30 are electrically connected to the electrodes 12 of the substrate 10 through the first solder alloy 14, and the first electronic component 30 is physically connected to the substrate 10 through the resin sheet 20. In the electronic substrate 100 according to the first embodiment, the electrodes 12 are formed in the groove portions 13 provided on the upper face of the base portion 11, and connection is made through the first solder alloy 14 while the tip portions of the bumps 32 are stored in the groove portions 13. Hence, even when the substrate 10 is deformed by a thermal stress, breakage of the connecting portion can be effectively prevented. In addition, in the first embodiment, each electrode 12 is formed on the bottom face and the side face of the corresponding groove portion 13, and this structure increases the area of the electrode 12 in contact with the bump 32. Hence, while the electronic substrate 100 is not increased, the connection strength between the bumps 32 and the electrodes 12 can be increased.

In the first embodiment, the electrodes 12 are formed on the bottom face and the side face of the groove portions 13 but may be formed only on the bottom face.

In the first embodiment, the resin sheet 20 is inserted between the substrate 10 and the first electronic component 30 to protect the connecting portions between the bumps 32 and the electrodes 12, but the resin sheet 20 is not necessarily used. When the connecting portion of the electronic substrate 100 needs higher strength, resin sealing for reinforcement may be performed in an additional step.

Figure 6A:
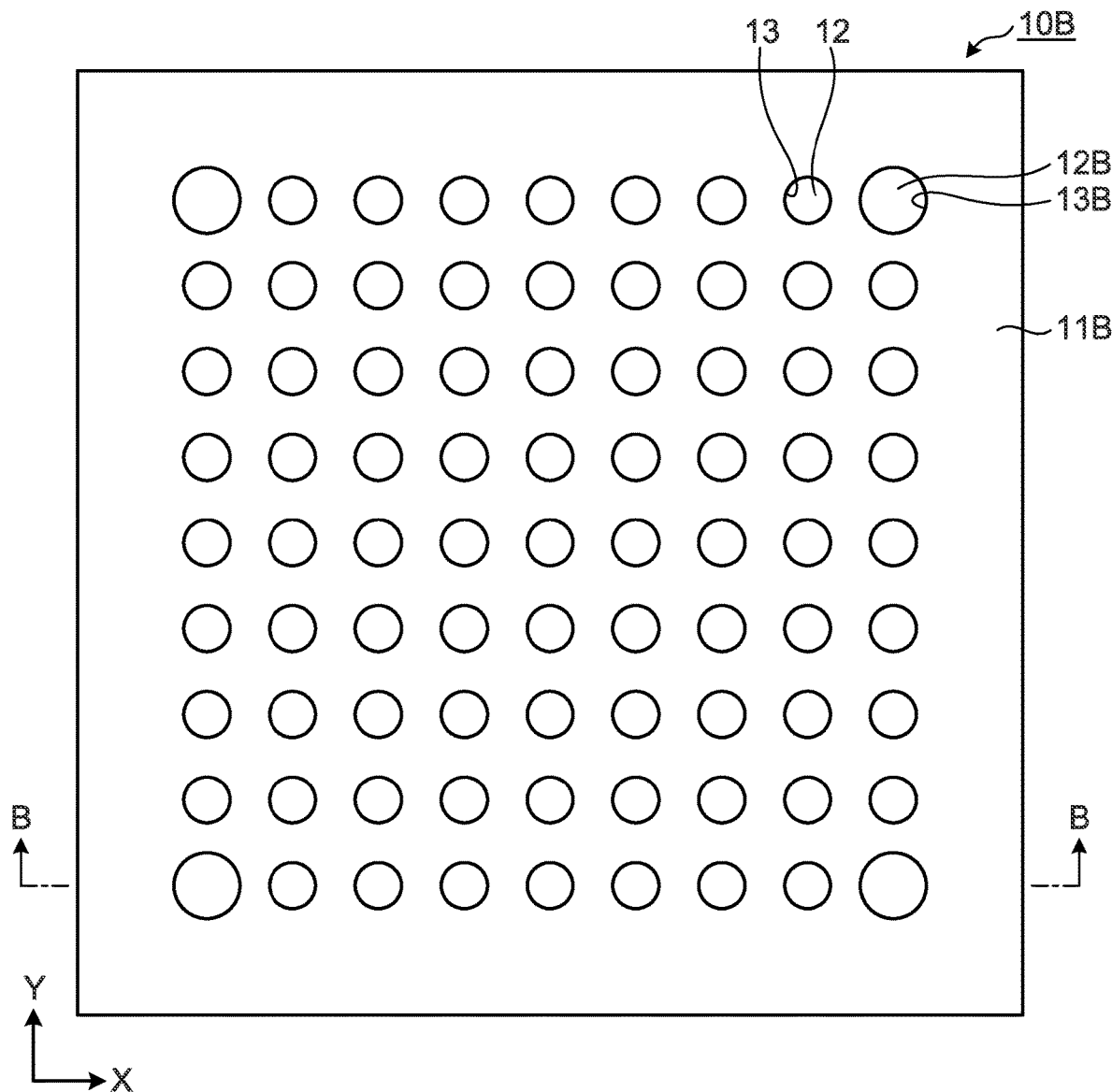
FIG. 6A is a plan view of a substrate according to a second embodiment.
Figure 6B:
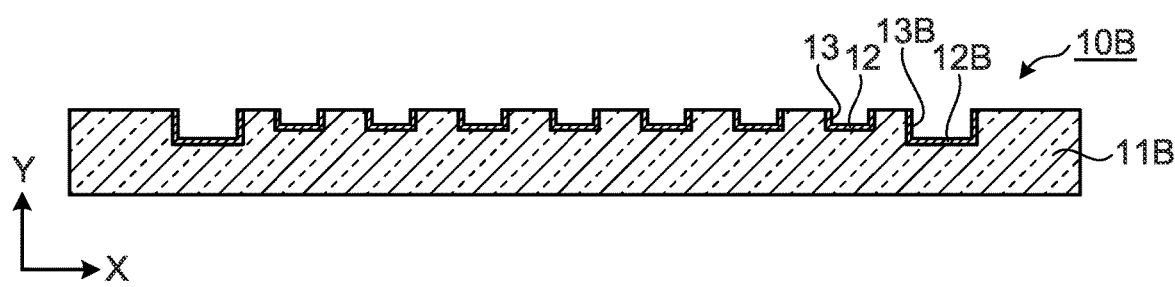
FIG. 6B is a plan view taken along line B-B in FIG. 6A.

FIG. 6A is a plan view of a substrate 10B according to a second embodiment, and FIG. 6B is a cross-sectional view taken along line B-B in FIG. 6A. The second embodiment will next be described, but identical or substantially identical components to those in the above embodiment and the like have the same reference numerals and are not described, and only different components will be described.

A substrate 10B includes a base portion 11B having groove portions 13 and groove portions 13B formed on the upper face and includes electrodes 12 and electrodes 12B made from an electric conductor and formed on the bottom face and the side face of the groove portions 13 and the groove portions 13B. The groove portions 13B are first groove portions located in four corner areas on the base portion 11, and the groove portions 13 are second groove portions having a smaller diameter than that of the groove portions 13B and are located in the area other than the four corner areas. As shown in FIG. 6B, the groove portions 13B have a larger depth than that of the groove portions 13.

Figure 7A:
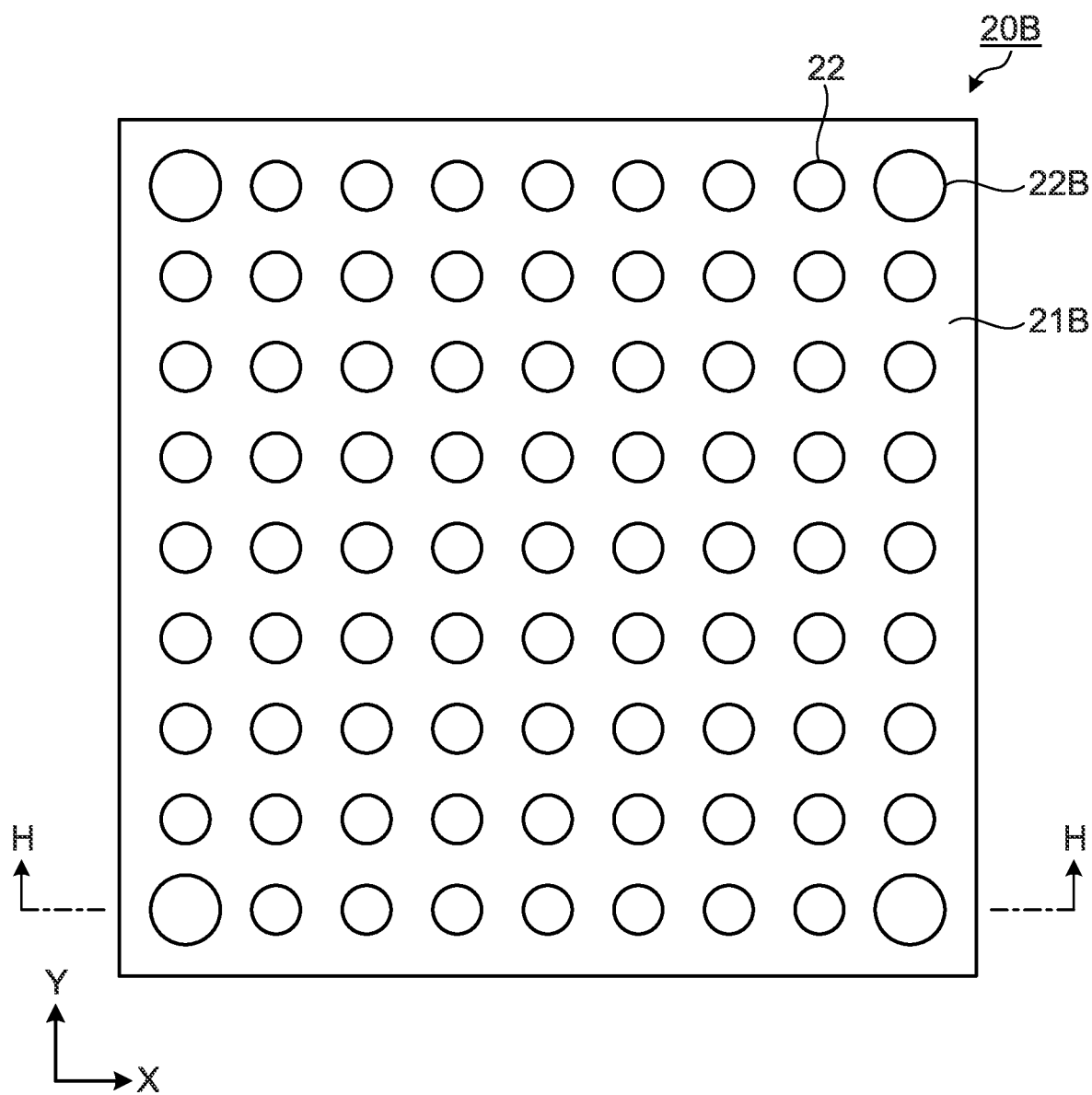
FIG. 7A is a plan view of a resin sheet according to the second embodiment.
Figure 7B:
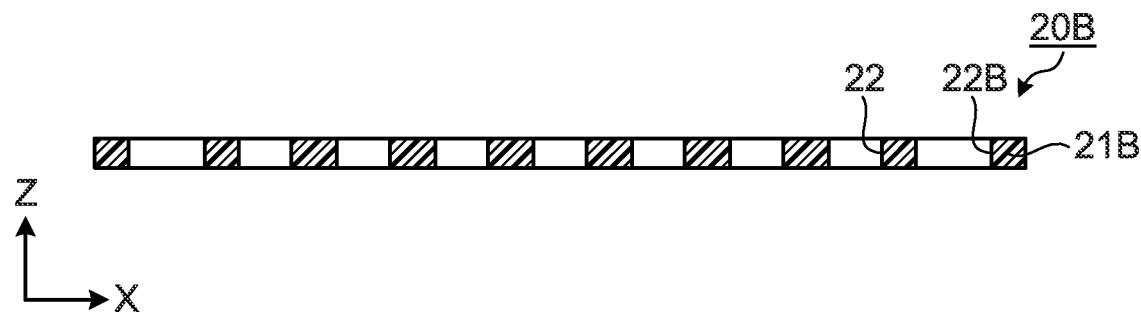
FIG. 7B is a cross-sectional view taken along line H-H in FIG. 7A.

FIG. 7A is a plan view of a resin sheet 20B according to the second embodiment, and FIG. 7B is a cross-sectional view taken along line H-H in FIG. 7A. The resin sheet 20B has a rectangular main body 21B and through-holes 22 and through-holes 22B penetrating the main body 21B in the thickness direction. The through-holes 22B are located in four corner areas on the main body 21B, and the through-holes 22 have a smaller diameter than that of the through-holes 22B and are located in the area other than the four corner areas.

Figure 8:
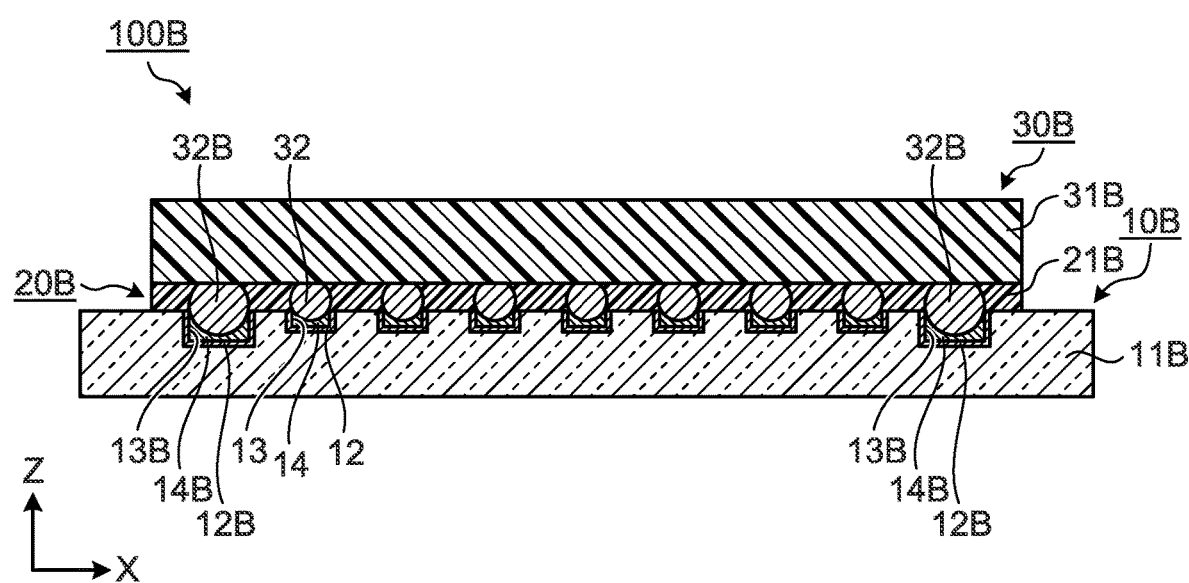
FIG. 8 is a cross-sectional view of an electronic substrate according to the second embodiment.

FIG. 8 is a cross-sectional view of an electronic substrate 100B according to the second embodiment. A first electronic component 30B includes a main body 31B, bumps 32, and bumps 32B. The bumps 32B are located in four corner areas on the lower face of the main body 31B, and the bumps 32 have a smaller diameter than that of the bumps 32B and are located in the area other than the four corner areas.

The electronic substrate 100B according to the second embodiment is, in the same manner as in the first embodiment, produced through a packing step, a resin sheet placing step, an electronic component placing step, and a mounting step. In the packing step, a first solder alloy 14 and a first solder alloy 14B are packed (inserted) in the groove portions 13 and the groove portions 13B, respectively. The first solder alloy 14 and the first solder alloy 14B are the same kind of solder alloy and differ only in the packing amount. In the resin sheet placing step, the placing is performed in such a way that the positions of the through-holes 22 and the through-holes 22B of the resin sheet 20B are fitted onto the groove portions 13 and the groove portions 13B, respectively, of the substrate 10B. In the electronic component placing step, the placing is performed in such a way that the positions of the bumps 32 and the bumps 32B of the first electronic component 30B are fitted onto the through-holes 22 and the through-holes 22B, respectively, of the resin sheet 20B. In the electronic component placing step, accordingly, the bumps 32 are stored in the through-holes 22 and the groove portions 13, and the bumps 32B are stored in the through-holes 22B and the groove portions 13B.

In the second embodiment, the large bumps 32B are located in four corner areas on the first electronic component 30B, and the corresponding large groove portions 13B and through-holes 22B are also located in four corner areas of the substrate 10B and resin sheet 20B. The placement of the large bumps 32B and groove portions 13B in the corner areas enables a further improvement in bonding strength of the connecting portions between the bumps 32B and the electrodes 12B located in the corner areas.

In the second embodiment, the electrodes 12 and the electrodes 12B are formed on the bottom face and the side face of the groove portions 13 and the groove portions 13B but may be formed only on the bottom face. In the second embodiment, the resin sheet 20B is inserted between the substrate 10B and the first electronic component 30B to protect the connecting portions between the bumps 32 and bumps 32B and the electrodes 12 and electrodes 12B, but the resin sheet 20B is not necessarily used.

Figure 9A:
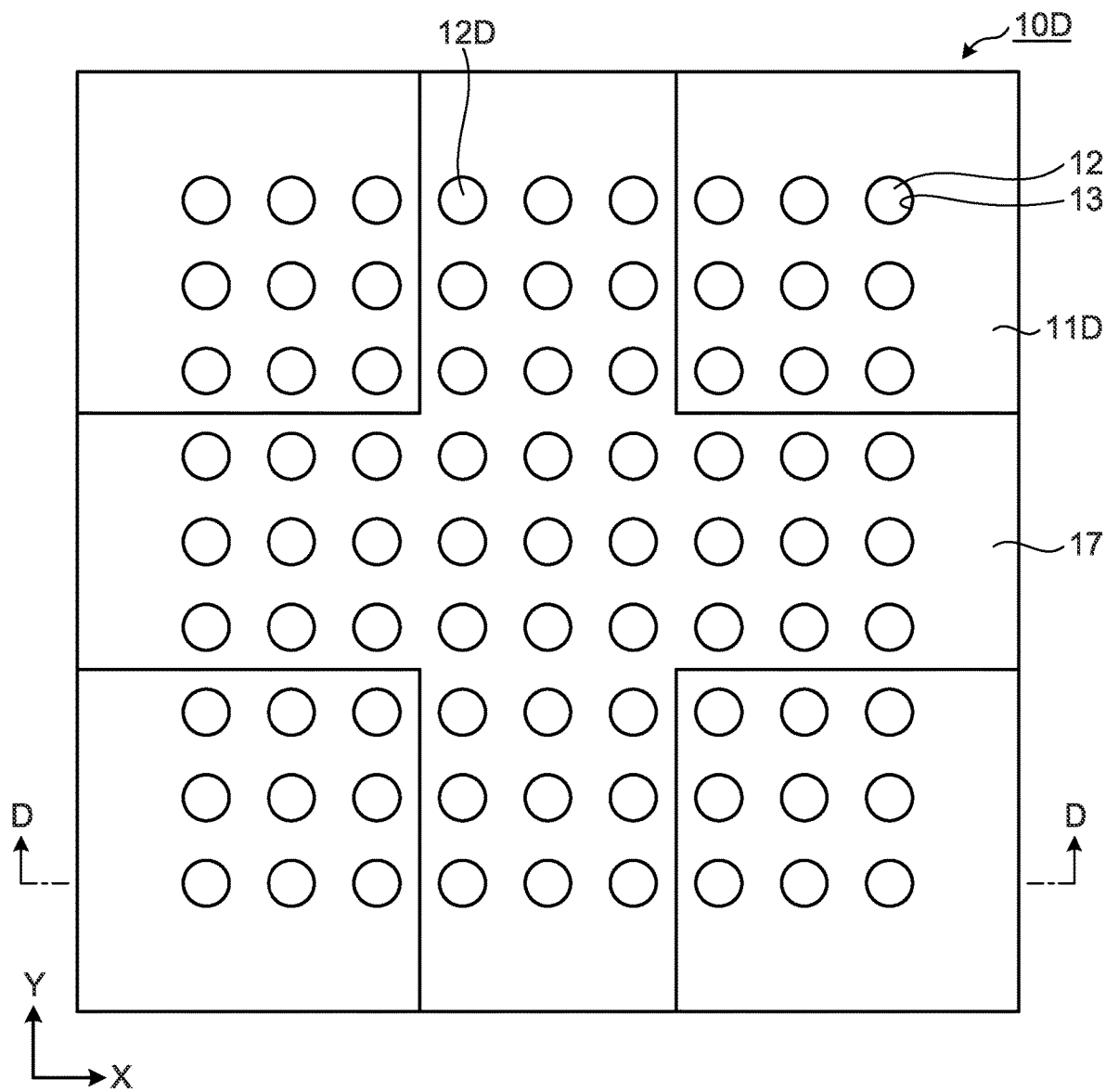
FIG. 9A is a plan view of a substrate according to a third embodiment.
Figure 9B:
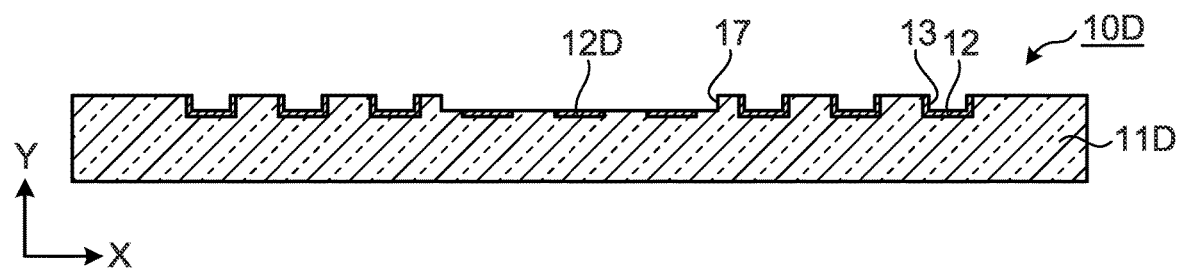
FIG. 9B is a cross-sectional view taken along line D-D in FIG. 9A.

FIG. 9A is a plane view of a substrate 10D according to a third embodiment, and FIG. 9B is a cross-sectional view taken along line D-D in FIG. 9A. The third embodiment will next be described, but identical or substantially identical components to those in the above embodiments and the like have the same reference numerals and are not described, and only different components will be described.

The substrate 10D includes a rectangular base portion 11D having groove portions 13 located in four corner areas on the upper face, electrodes 12 are provided on the bottom face and the side face of the groove portions 13, a recessed portion 17 located on the upper face other than the four corner areas with the groove portions 13 of the base portion 11D and recessed from the upper face of the four corner areas, and electrodes 12D are provided on the recessed portion 17.

Figure 10A:
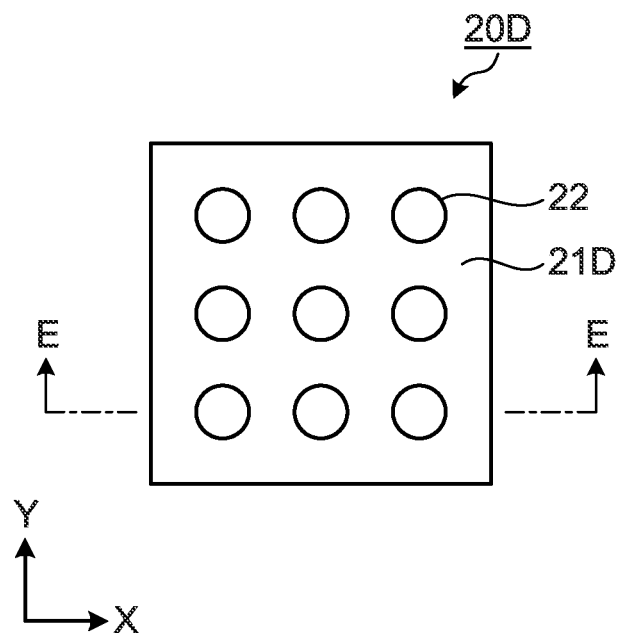
FIG. 10A is a plan view of a resin sheet according to the third embodiment.
Figure 10B:
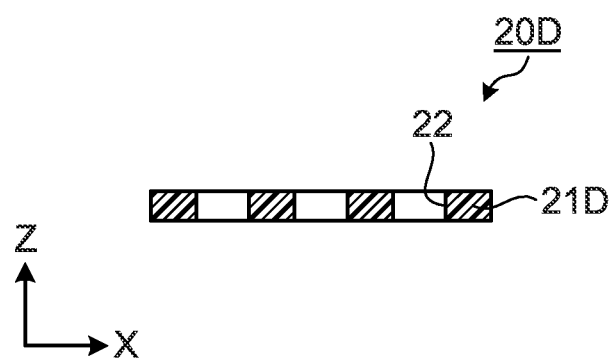
FIG. 10B is a cross-sectional view taken along line E-E in FIG. 10A.

FIG. 10A is a plan view of a resin sheet 20D according to the third embodiment, and FIG. 10B is a cross-sectional view taken along line E-E in FIG. 10A. The resin sheet 20D includes a plate shaped main body 21D and through-holes 22 penetrating the main body 21D in the thickness direction.

Figure 11:
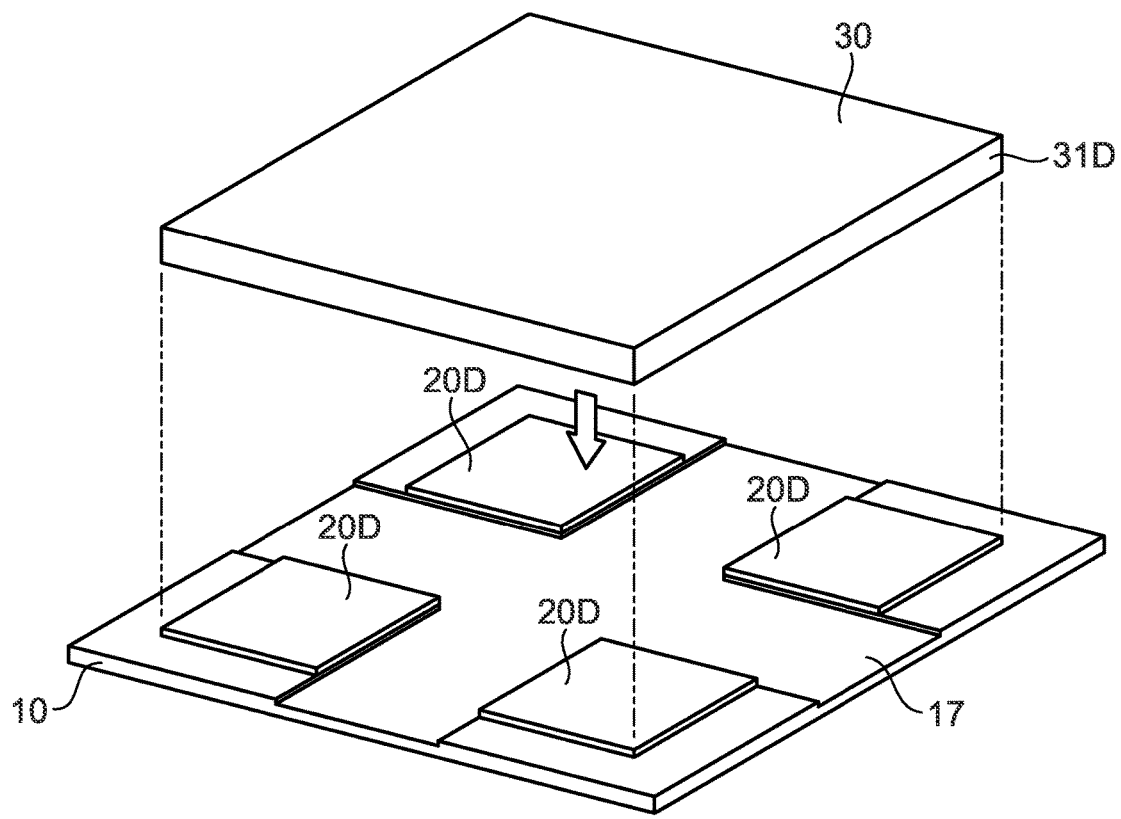
FIG. 11 is a view illustrating a method for producing the electronic substrate according to the third embodiment and is a view in which a first electronic component is fitted to resin sheets attached to a substrate.
Figure 12:
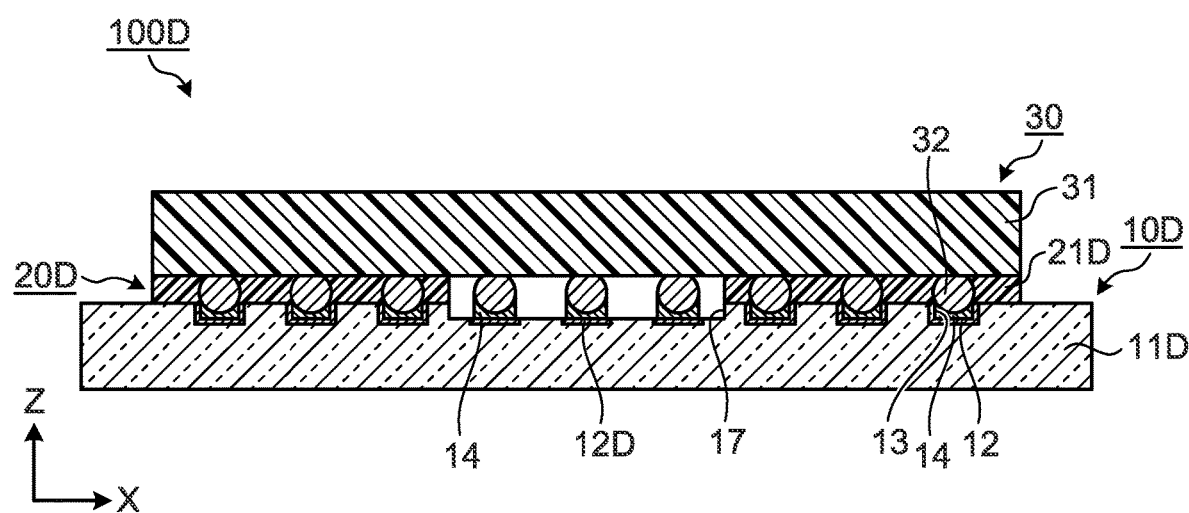
FIG. 12 is a cross-sectional view of the electronic substrate according to the third embodiment and is a cross-sectional view in which the first electronic component is placed on the substrate.

FIG. 11 is a view illustrating a method for producing an electronic substrate 100D according to the third embodiment. In FIG. 11, the electrodes 12D of the substrate 10 and the through-holes 22 of the resin sheets 20D are not shown.

The electronic substrate 100D is, in the same manner as the electronic substrate 100 in the first embodiment, produced through a packing step, a resin sheet placing step, an electronic component placing step, and a mounting step. After the packing step of packing and applying a first solder alloy 14 in the groove portions 13 and onto the electrodes 12D of the substrate 10D, resin sheets 20D each having a smaller area than that of the main body 31 of the first electronic component 30 are placed on the substrate 10D at positions corresponding to four corner areas of the first electronic component 30, as shown in FIG. 11. Subsequently, by performing the electronic component placing step of placing the first electronic component 30 in such a way that the four corner areas thereof are fitted onto the corresponding resin sheets 20D and the mounting step, the electronic substrate 100D can be produced.

In the electronic substrate 100D, even when the substrate 10D is deformed due to a thermal load, some of the bumps 32 in the four corner areas on the first electronic component 30, to which the largest stress load is applied, are stored in the groove portions 13, and the peripheries of the bumps 32 are sealed by the resin sheet 20D. Hence, the connecting portions between the bumps 32 and the electrodes 12 can be effectively protected.

In the third embodiment, four resin sheets 20D each having nine through-holes 22 are used, but the sheet is not limited to this. For example, resin sheets having a smaller area (for example, each having four through-holes) may be located in the four corner areas on the first electronic component 30 and in the areas located midway of the sides between the corners.

In the third embodiment, the electrodes 12 are formed on the bottom face and the side face of the groove portions 13 but may be formed only on the bottom face. In the third embodiment, the resin sheets 20D are inserted between the substrate 10B and the first electronic component 30D to protect the connecting portions between the bumps 32 and the electrodes 12 and the electrodes 12D, but the resin sheets 20D are not necessarily used.

Figure 13:
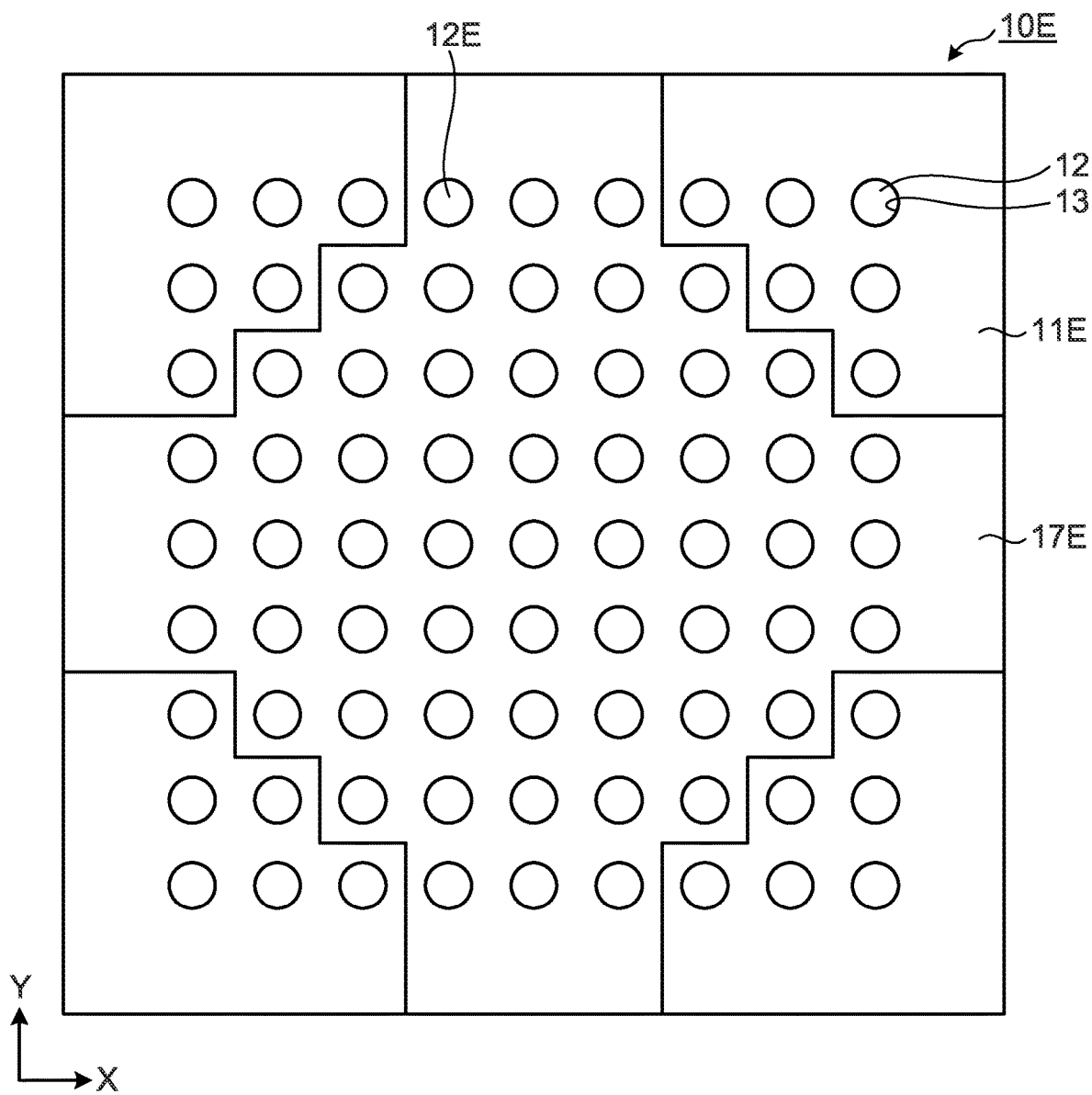
FIG. 13 is a plan view of a substrate according to an alternative embodiment of the third embodiment.

FIG. 13 is a plan view of a substrate 10E according to an alternative embodiment of the third embodiment. The substrate 10E includes a base portion 11E having groove portions 13 located in four corner areas on the upper face, electrodes 12 provided on the bottom face and the side face of the groove portions 13, a recessed portion 17E located on the upper face other than the four corner areas with the groove portions 13 of the base portion 11E and recessed from the upper face with the groove portions 13, and electrodes 12E provided on the recessed portion 17E. In the substrate 10D according to the third embodiment, the upper face shape of the base portion 11D with the groove portions 13 is rectangular, whereas in the substrate 10E, the upper face shape of the base portion 11E with the groove portions 13 is polygonal. Also in the case of using the substrate 10E according to the alternative embodiment, as with the third embodiment, some of the bumps 32 in the four corner areas on the first electronic component 30, to which the largest stress load is applied, are stored in the groove portions 13 and are connected to the electrodes 12, and thus the strength of the connection portion can be improved.

Figure 14A:
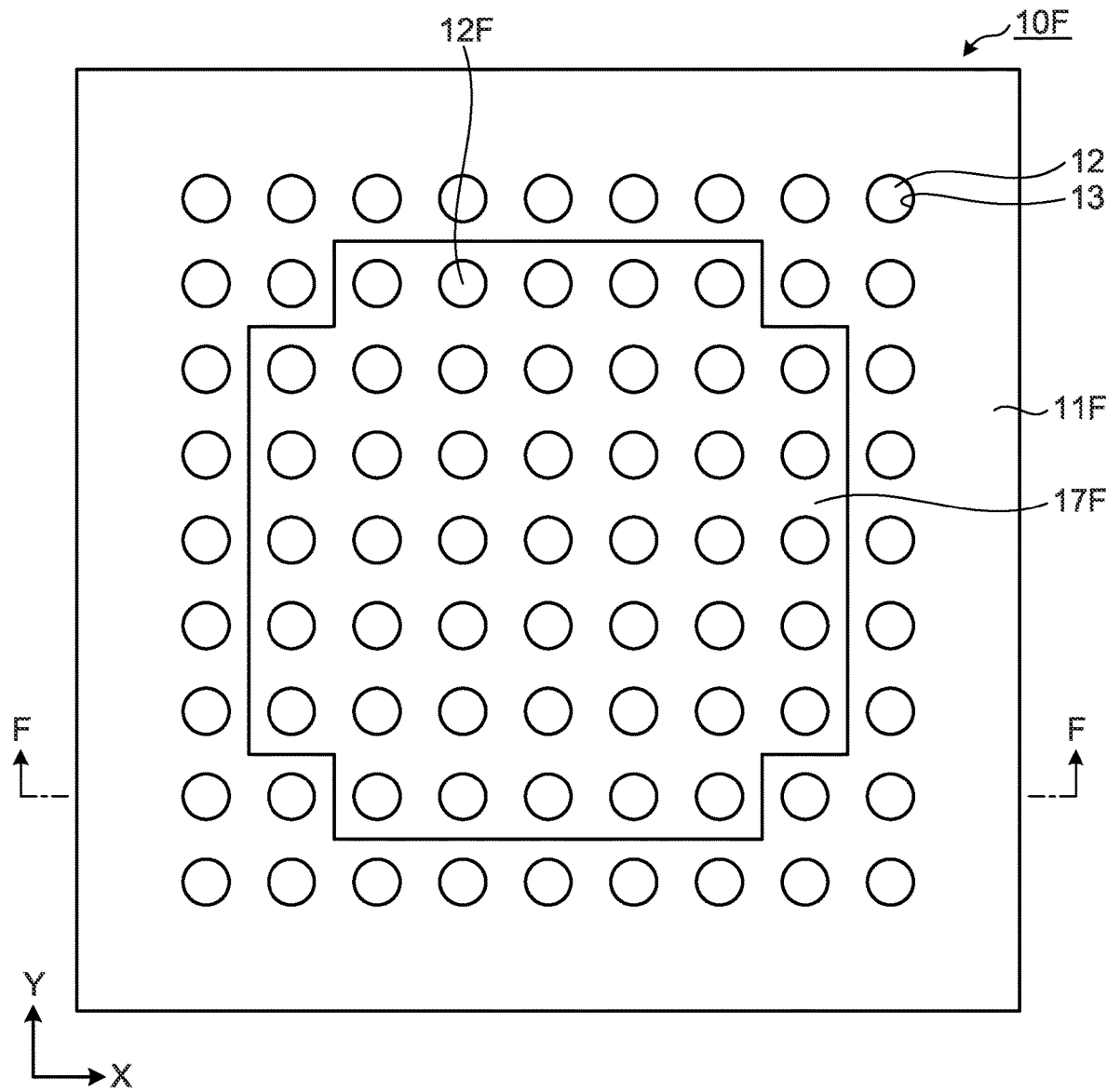
FIG. 14A is a plan view of a substrate according to a fourth embodiment.
Figure 14B:
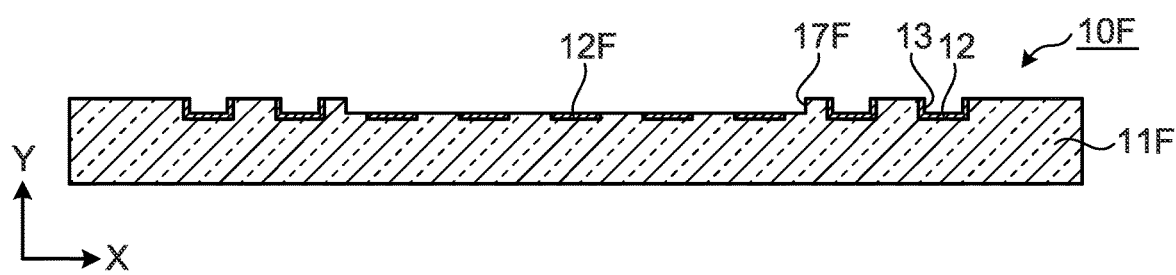
FIG. 14B is a cross-sectional view taken along line F-F in FIG. 14A.

FIG. 14A is a plan view of a substrate 10F according to a fourth embodiment, and FIG. 14B is a cross-sectional view taken along line F-F in FIG. 14A. The fourth embodiment will next be described, but identical or substantially identical components to those in the above embodiments and the like have the same reference numerals and are not described, and only different components will be described.

The substrate 10F includes a base portion 11F having groove portions 13 located in an outer peripheral area on the upper face, electrodes 12 provided on the bottom face and the side face of the groove portions 13, a recessed portion 17F located on the upper face in the inner area from the outer peripheral area with the groove portions 13 of the base portion 11F and recessed from the upper face of the outer peripheral area, and electrodes 12F provided on the recessed portion 17F.

The substrate 10F stores, in the groove portions 13, tip portions of bumps 32 located in the peripheral area of a first electronic component 30 and makes the connection with the electrodes 12 formed in the groove portions 13, and thus the connecting portions between the bumps 32 of the first electronic component 30 in the peripheral area, to which a large stress load is applied, and the electrodes 12 can be protected. In addition, use of a resin sheet that seals the periphery of the bumps 32 located in the peripheral area on the first electronic component 30 improves the bonding strength of the connecting portions between the bumps and the electrodes 12, and the environmental effect including humidity on the connecting portion can be blocked.

In the fourth embodiment, a line of groove portions 13 is located in the outer peripheral area of the substrate 10F, and additional groove portions 13 are located near the four corner areas, but the arrangement of groove portions 13 is not limited to this. Only a line of groove portions 13 may be arranged, or two lines may be arranged.

Figure 15:
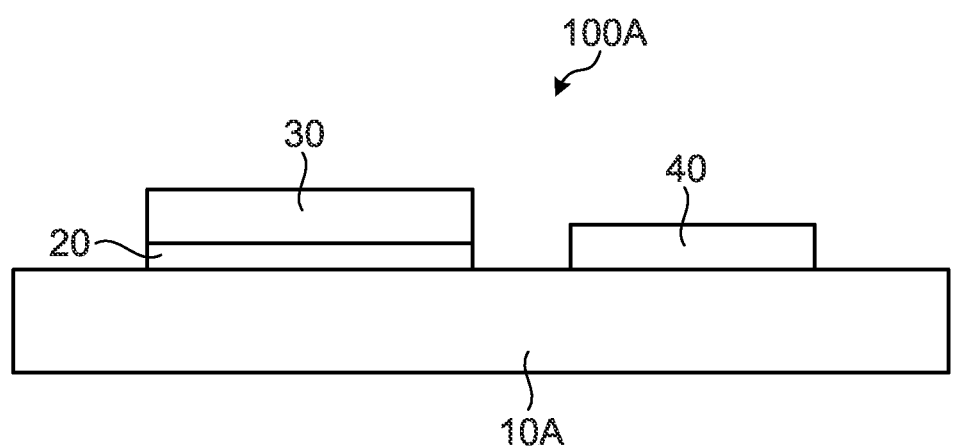
FIG. 15 is a schematic view of an electronic substrate according to a fifth embodiment.

FIG. 15 is a schematic view of an electronic substrate 100A according to a fifth embodiment. The electronic substrate 100A includes a substrate 10A, a first electronic component 30 mounted through a resin sheet 20 on the substrate 10A, and a second electronic component 40. In the electronic substrate 100A, the single first electronic component 30 and the single second electronic component 40 are mounted on the substrate 10A, and in another electronic substrate 100A, two or more first electronic components 30 and/or two or more second electronic components 40 may be mounted on a substrate 10A. The fifth embodiment will next be described, but identical or substantially identical components to those in the above embodiments have the same reference numerals and are not described, and only different components will be described.

As the first electronic component 30 and the second electronic component 40, integrated circuit (IC) chips such as a large scale integration (LSI) and a small scale integration (SSI) can be used. A component relatively expensive and susceptible to heat, such as a central processing unit (CPU), a graphic processing unit (GPU), a memory, and a solid state drive (SSD), is preferably used as the first electronic component 30, and another component is preferably used as the second electronic component 40.

Figure 16A:
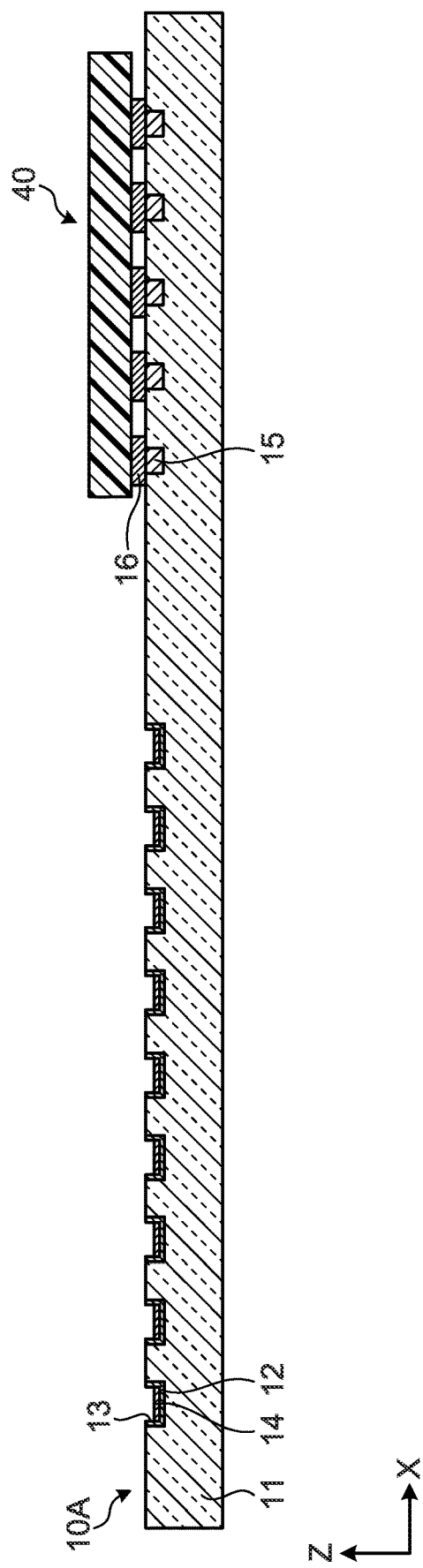
FIG. 16A is a view illustrating a method for producing the electronic substrate according to the fifth embodiment and is a cross-sectional view in which a second electronic component is placed on a substrate.
Figure 16B:
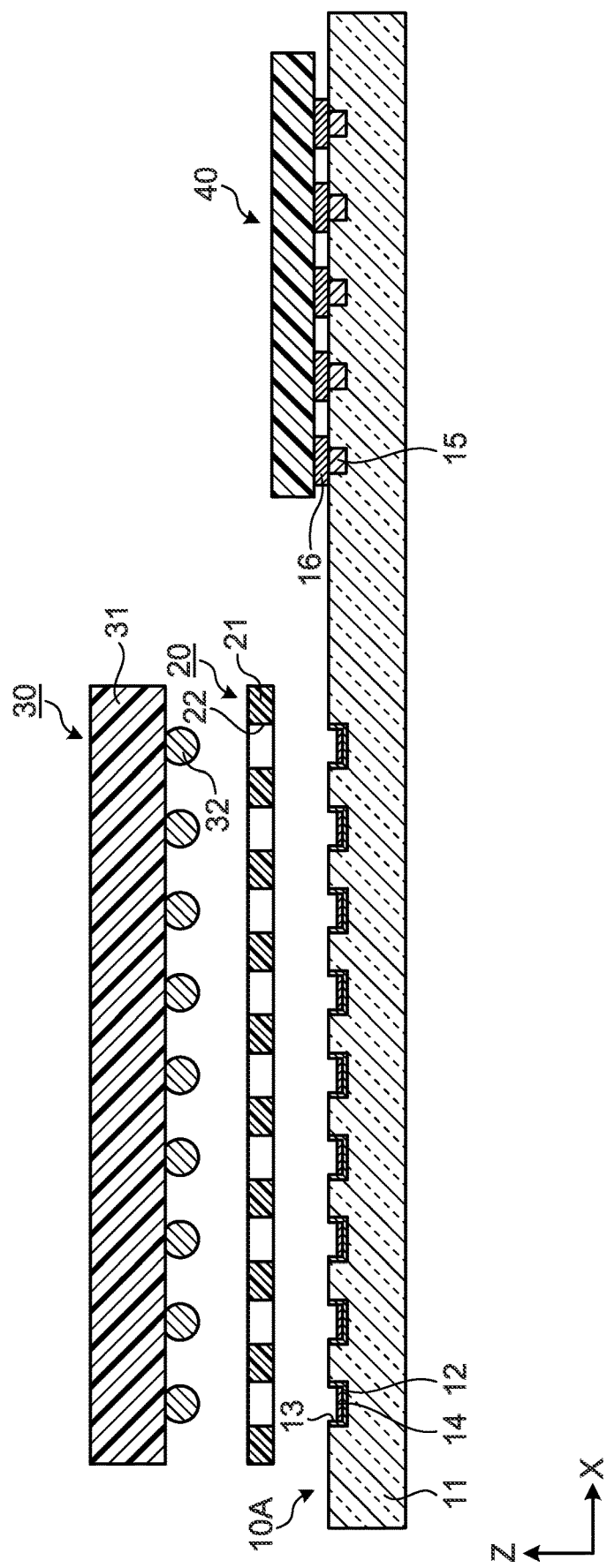
FIG. 16B is a view illustrating the method for producing the electronic substrate according to the fifth embodiment and is a cross-sectional view illustrating the method of placing a resin sheet and a first electronic component on the substrate with the second electronic component.
Figure 16C:
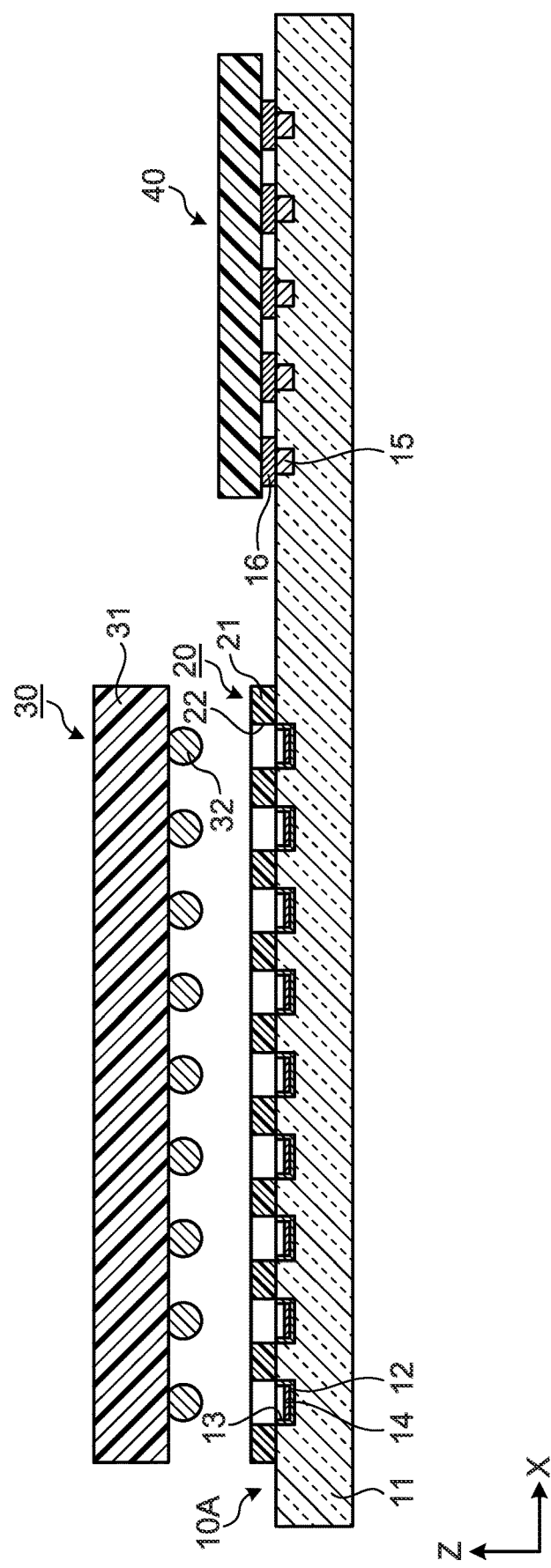
FIG. 16C is a view illustrating the method for producing the electronic substrate according to the fifth embodiment and is a cross-sectional view showing the state in which the resin sheet for the first electronic component is attached to the substrate with the second electronic component.
Figure 16D:
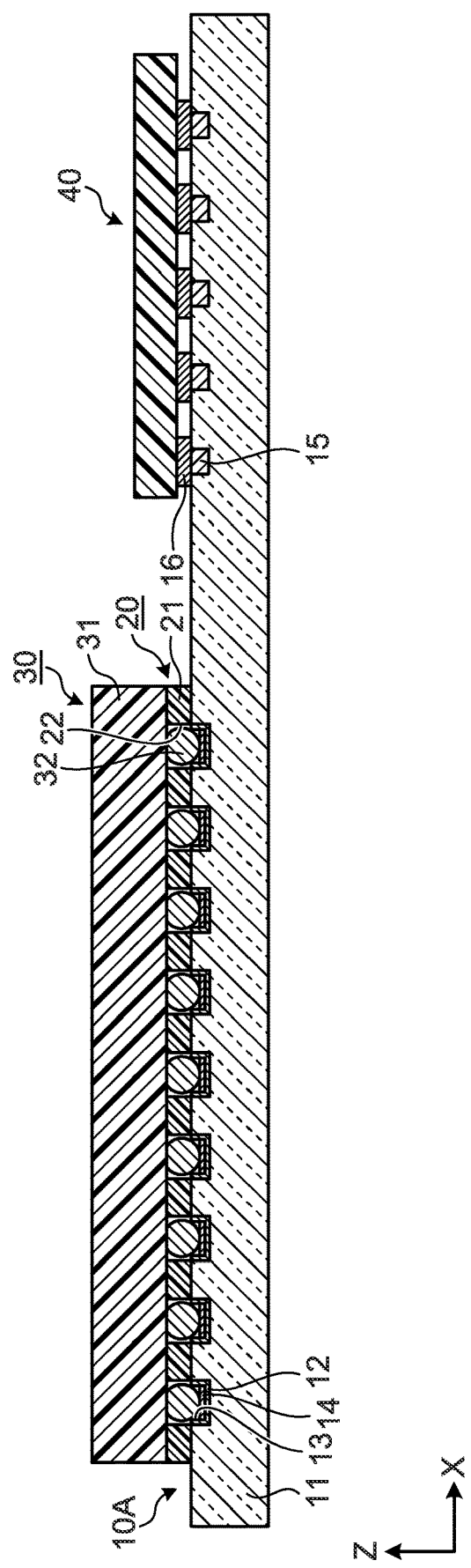
FIG. 16D is a view illustrating the method for producing the electronic substrate according to the fifth embodiment and is a cross-sectional view in which the resin sheet and the first electronic component are attached to the substrate with the second electronic component.
Figure 16E:
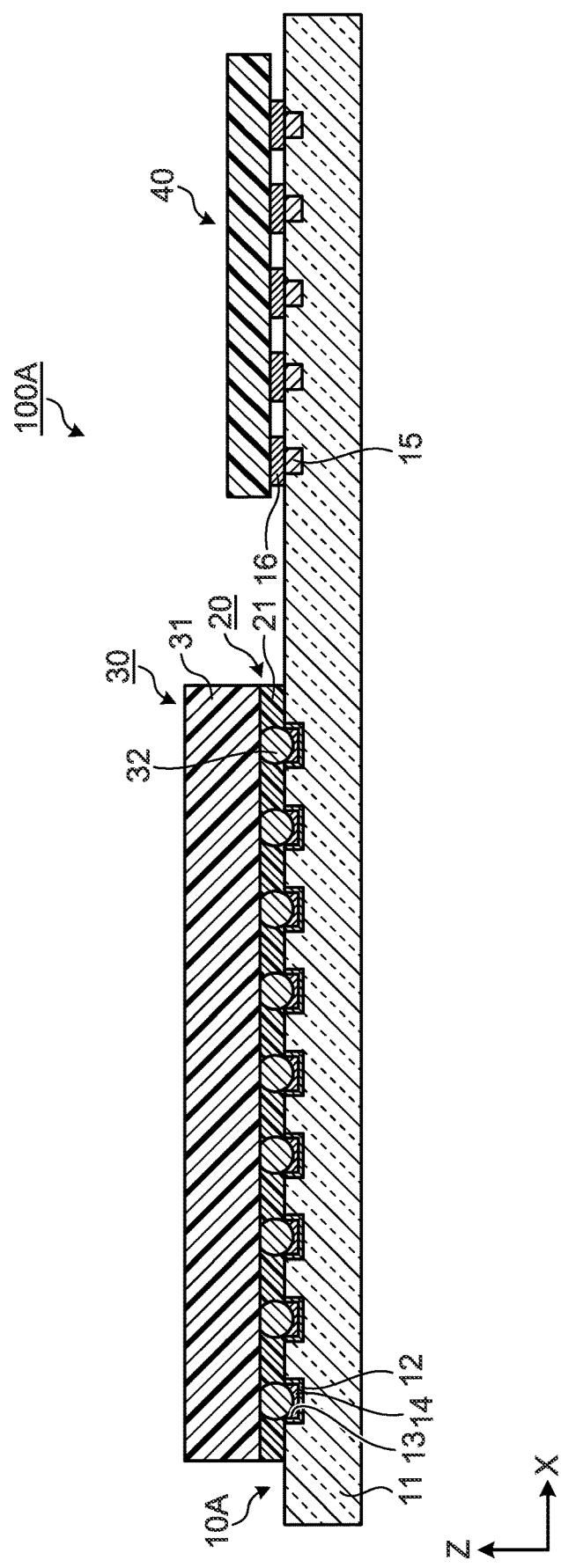
FIG. 16E is a view illustrating the method for producing the electronic substrate according to the fifth embodiment and is a cross-sectional view in which the first electronic component is mounted by heat.

In the fifth embodiment, a preliminary mounting step is performed before a packing step. In the preliminary mounting step, a second electronic component 40 is mounted on a substrate 10A as shown in FIG. 16A. The second electronic component 40 includes electrode portions (not shown), and the electrode portions are electrically connected through a second solder alloy 16 to electrodes 15. The preliminary mounting step is preferably performed by reflowing. The second solder alloy 16 can be applied by printing through a mask on the electrodes 15 or by jet printing, for example.

After the preliminary mounting step, by performing a packing step, a resin sheet placing step, an electronic component placing step, and a mounting step as shown in FIG. 16B to FIG. 16E, an electronic substrate 100A can be produced.

The second solder alloy 16 used in the fifth embodiment preferably has a higher melting point than that of the first solder alloy 14. In the fifth embodiment, the second electronic component 40 is connected to the electrodes 15 with the second solder alloy 16, and then the first electronic component 30 is connected to electrodes 12 with the first solder alloy 14. This is because the re-melting of the second solder alloy 16 is prevented at the time of mounting of the first electronic component 30. When a low-melting solder having a melting point of 150° C. or less is used as the first solder alloy 14, the second solder alloy 16 preferably has a melting point of about 180° C.

When a second electronic component 40 that has bumps and is to be flip-chip mounted on the substrate 10A is mounted, a substrate 10A may have groove portions configured to store the bumps of the second electronic component 40, and the bumps of the second electronic component 40 may be mounted with electrodes formed in the groove portions with the second solder alloy.

In addition to the effects of the first embodiment, the electronic substrate 100A according to the fifth embodiment can include different types of electronic components that are mounted in consideration of heat resistance or the like of the electronic components, and the electronic substrate 100A obtains higher reliability.

The invention claimed is:

1. A substrate on which a first electronic component having a plurality of bumps is to be mounted, the substrate comprising:
   a base portion including an insulator and having, on an upper face thereof, a plurality of groove portions each configured to receive a tip portion of a corresponding one of the bumps of the first electronic component; and
   a plurality of first electrodes on at least a bottom face of each of the plurality of groove portions wherein
   the plurality of groove portions are located in an outer peripheral area on the base portion, the base portion includes a recessed portion located inward of the outer peripheral area, an upper face of the recessed portion being a flat surface which is recessed from an upper face of the outer peripheral area, a plurality of second electrodes are configured to be connected to the plurality of bumps configured to be disposed in the recessed portion, and an upper surface of each of the plurality of second electrodes being flush with an upper surface of the recessed portion.

2. The substrate according to claim 1, wherein the plurality of first electrodes are on the bottom face and a side face of each of the plurality of groove portions.

3. The substrate according to claim 1, wherein a plurality of the groove portions are on the upper face in a grid pattern.

* * * * *